US012696627B2

(12) United States Patent
Kim

(10) Patent No.: US 12,696,627 B2
(45) Date of Patent: Jul. 28, 2026

(54) DISPLAY DEVICE

(71) Applicant: LG Display Co., Ltd., Seoul (KR)

(72) Inventor: Hanil Kim, Paju-si (KR)

(73) Assignee: LG Display Co., Ltd. (KR)

( * ) Notice: Subject to any disclaimer, the term of this patent is extended or adjusted under 35 U.S.C. 154(b) by 403 days.

(21) Appl. No.: 18/398,420

(22) Filed: Dec. 28, 2023

(65) Prior Publication Data

US 2024/0224603 A1 Jul. 4, 2024

(30) Foreign Application Priority Data

Dec. 30, 2022 (KR) ........................ 10-2022-0190785

(51) Int. Cl.
H10K 59/122 (2023.01)
H10K 59/80 (2023.01)
(52) U.S. Cl.
CPC ......... H10K 59/122 (2023.02); H10K 59/873 (2023.02)
(58) Field of Classification Search
CPC ........................... H10K 59/122; H10K 59/873
See application file for complete search history.

(56) References Cited

U.S. PATENT DOCUMENTS

2022/0165990 A1* 5/2022 Lee ...................... H10K 50/846

FOREIGN PATENT DOCUMENTS

| KR | 102086393 | B1 | * | 3/2020 | ........... H10K 59/873 |
| KR | 20200070811 | A | * | 6/2020 | ........... H10K 59/874 |
| KR | 20200082752 | A | | 7/2020 | |
| KR | 20200082764 | A | * | 7/2020 | ......... H10K 59/8731 |
| KR | 102286343 | B1 | * | 8/2021 | ......... H10K 50/8426 |
| KR | 20230093870 | A | | 6/2023 | |

* cited by examiner

*Primary Examiner* — Jeff W Natalini
*Assistant Examiner* — Rose Keagy
(74) *Attorney, Agent, or Firm* — Fish & Richardson P.C.

(57) ABSTRACT

A display device according to an exemplary aspect of the present disclosure includes a substrate divided into an active area and a non-active area including a gate-in-panel (GIP) area, a planarization layer disposed over the substrate and extending to the non-active area, a bank disposed over the planarization layer and extending to the non-active area, an encapsulation layer disposed over the bank and a hydrogen absorption layer disposed between the bank and the planarization layer to cover the GIP area, so that it is possible to improve characteristics and reliability of an oxide thin film transistor by blocking introduction of hydrogen into the oxide thin film transistor of a GIP circuit.

20 Claims, 8 Drawing Sheets

DISPLAY DEVICE

CROSS-REFERENCE TO RELATED APPLICATION

This application claims the priority to Korean Patent Application No. 10-2022-0190785 filed on Dec. 30, 2022, which is hereby incorporated by reference in its entirety.

BACKGROUND

Field of the Disclosure

The present disclosure relates to a display device, and more particularly to a display device using an oxide thin film transistor.

Description of the Background

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Among various display devices, an organic light emitting display device is a self-luminous display device and may be manufactured to be light and thin since it does not require a separate light source, unlike a liquid crystal display device having a separate light source. In addition, the organic light emitting display device has advantages in terms of power consumption due to a low voltage driving, and is excellent in terms of a color implementation, a response speed, a viewing angle, and a contrast ratio (CR). Therefore, organic light emitting display devices have been expected to be used in various application fields.

SUMMARY

Accordingly, the present disclosure is directed to a display device that substantially obviates one or more of problems due to limitations and disadvantages described above.

More specifically, the present disclosure is to provide a display device using an oxide thin film transistor with improved product reliability.

The present disclosure is also to provide a display device having dummy pixels.

Further, the present disclosure is to provide a display device in which introduction of hydrogen into an oxide thin film transistor of a gate-in-panel (GIP) is prevented.

The present disclosure is not limited to the above-mentioned, and other features, which are not mentioned above, may be clearly understood by those skilled in the art from the following descriptions.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display device according to an exemplary aspect of the present disclosure may include a substrate divided into an active area and a non-active area including a gate-in-panel (GIP) area, a planarization layer disposed over the substrate and extending to the non-active area, a bank disposed over the planarization layer and extending to the non-active area, an encapsulation layer disposed over the bank and a hydrogen absorption layer disposed between the bank and the planarization layer to cover the GIP area.

Other detailed matters of the exemplary aspects are included in the detailed description and the drawings.

According to the present disclosure, characteristics and reliability of an oxide thin film transistor may be improved by forming a hydrogen adsorption layer to cover a GIP area and blocking an introduction of hydrogen into the oxide thin film transistor of a GIP circuit.

According to the present disclosure, a dummy pixel area is disposed between a GIP area and an active area to serve as a buffer, so that it is possible to cope with process variation.

The effects according to the present disclosure are not limited to the contents exemplified above, and more various effects are included in the present disclosure.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure. In the drawings:

FIG. 5 is a view illustrating a cross-section taken along line I-I' of FIG. 3;

FIG. 6 is a cross-sectional view illustrating a portion of a display panel according to a second exemplary aspect of the present disclosure;

FIG. 7 is a cross-sectional view illustrating a portion of a display panel according to a third exemplary aspect of the present disclosure; and FIG. 8 is a cross-sectional view illustrating a portion of a display panel according to a fourth exemplary aspect of the present disclosure.

DETAILED DESCRIPTION

Figure 1:
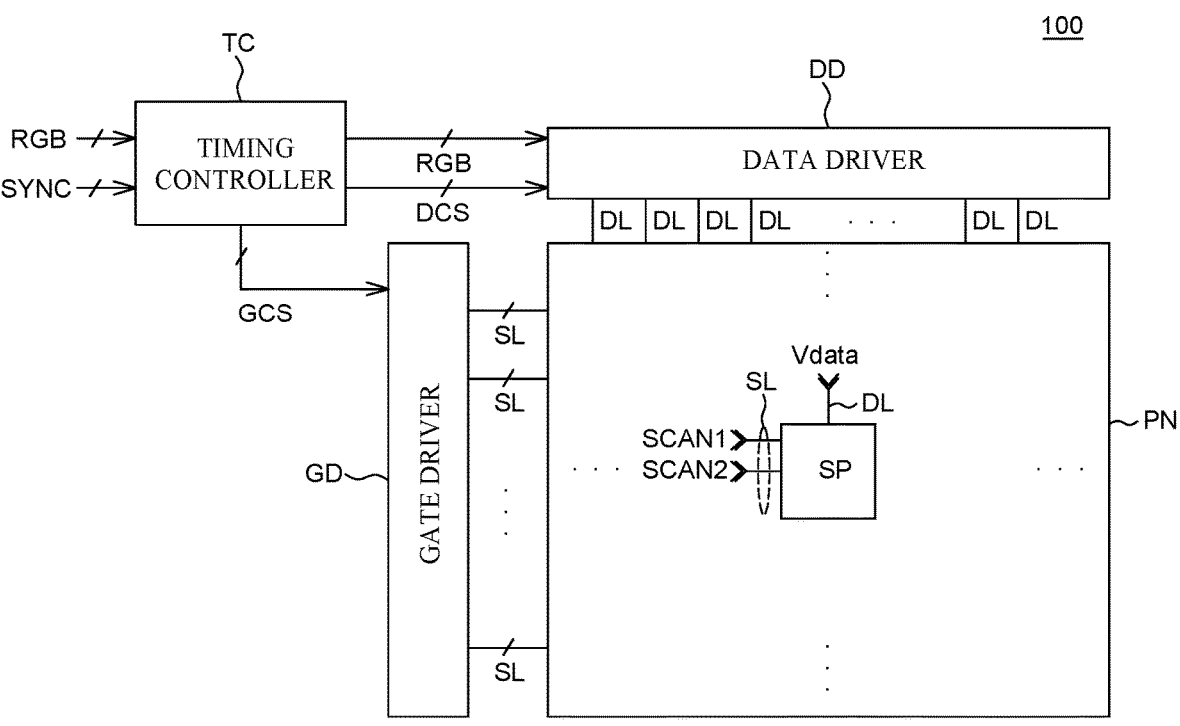
FIG. 1 is a schematic configuration diagram of a display device according to the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the disclosure. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the disclosure.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, exemplary aspects of the present disclosure will be described in detail with reference to accompanying drawings.

FIG. 1 is a schematic configuration diagram of a display device according to the present disclosure.

Referring to FIG. 1, a display device 100 may include a display panel PN including a plurality of sub-pixels SP, a gate driver GD and a data driver DD for supplying various signals to the display panel PN, and a timing controller TC for controlling the gate driver GD and the data driver DD.

The gate driver GD may supply a plurality of scan signals to a plurality of scan lines SL according to a plurality of gate control signals GCS provided from the timing controller TC. The plurality of scan signals may include a first scan signal SCAN1 and a second scan signal SCAN2.

The data driver DD may convert image data RGB input from the timing controller TC into a data signal Vdata using a reference gamma voltage according to a plurality of data control signals DCS provided from the timing controller TC. In addition, the data driver DD may supply the converted data signal Vdata to a plurality of data lines DL.

The timing controller TC aligns image data RGB input from the outside and supplies it to the data driver DD, and may generate a gate control signal GCS and a data control signal DCS using synchronization signals SYNC input from the outside.

Figure 2:
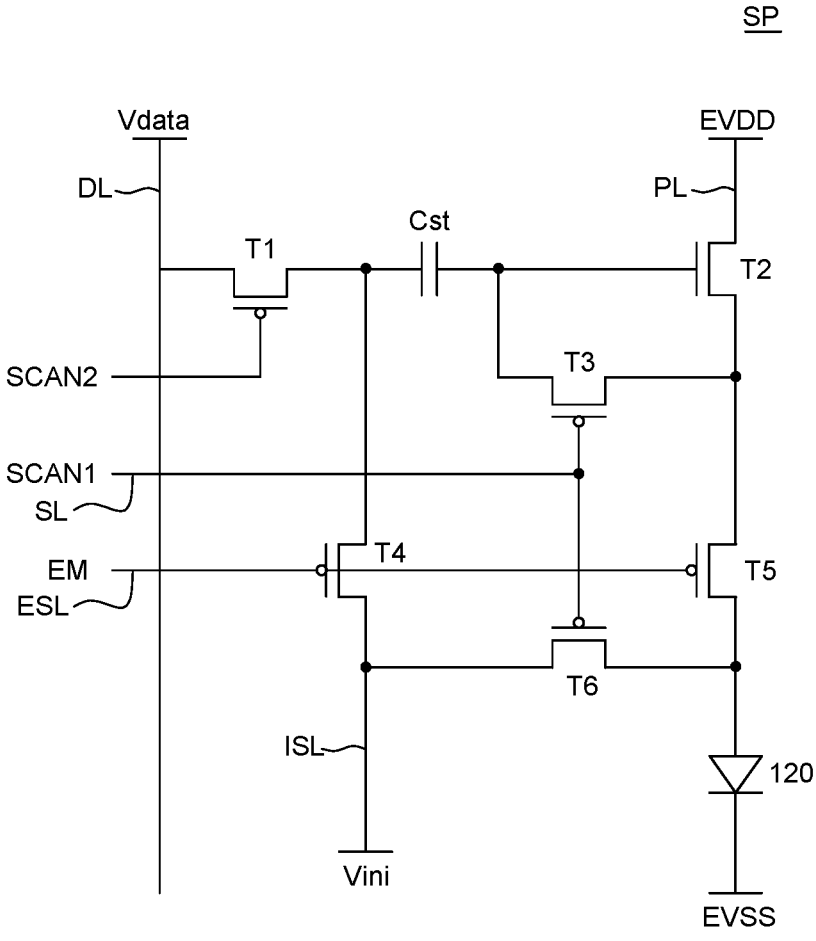
FIG. 2 is a circuit diagram of a sub-pixel of the display device of FIG. 1.

FIG. 2 is a circuit diagram of a sub-pixel of the display device of FIG. 1.

Referring to FIG. 2, a pixel circuit of each of the plurality of sub-pixels SP may include first to sixth transistors T1, T2, T3, T4, T5, and T6 and a capacitor Cst.

The first transistor T1 may be connected to a second scan line and be controlled by the second scan signal SCAN2 supplied through the second scan line. The first transistor T1 may be electrically connected between the data line supplying the data signal Vdata and the capacitor Cst.

The second transistor T2 may be electrically connected between a high potential power line to which a high potential power signal EVDD is supplied and the fifth transistor T5. In addition, for example, a gate electrode of the second transistor T2 may be electrically connected to the capacitor Cst.

For example, the third transistor T3 may be controlled by the first scan signal SCAN1 supplied through a first scan line and may compensate for a threshold voltage of the second transistor T2, and the third transistor T3 may be referred to as a compensation transistor.

The fourth transistor T4 may be electrically connected to an initialization signal line to which an initialization signal Vini is supplied, and the capacitor Cst. In addition, the fourth transistor T4 may be controlled by an emission control signal EM which is supplied through an emission control signal line.

For example, the fifth transistor T5 is electrically connected between the second transistor T2 and a light emitting element 120 and may be controlled by the emission control signal EM which is supplied through the emission control signal line.

The sixth transistor T6 is electrically connected between the initialization signal line to which the initialization signal Vini is supplied and an anode of the light emitting element 120, and may be controlled by the first scan signal SCAN1 supplied through the first scan line.

As described above, although a case in which the pixel circuit of each of the plurality of sub-pixels SP includes the first to sixth transistors T1, T2, T3, T4, T5, and T6 and the capacitor Cst is exemplified, the present disclosure is not limited thereto.

Hereinafter, a structure of the display panel PN according to the first exemplary aspect of the present disclosure will be described in more detail with reference to FIGS. 3 to 5.

Figure 3:
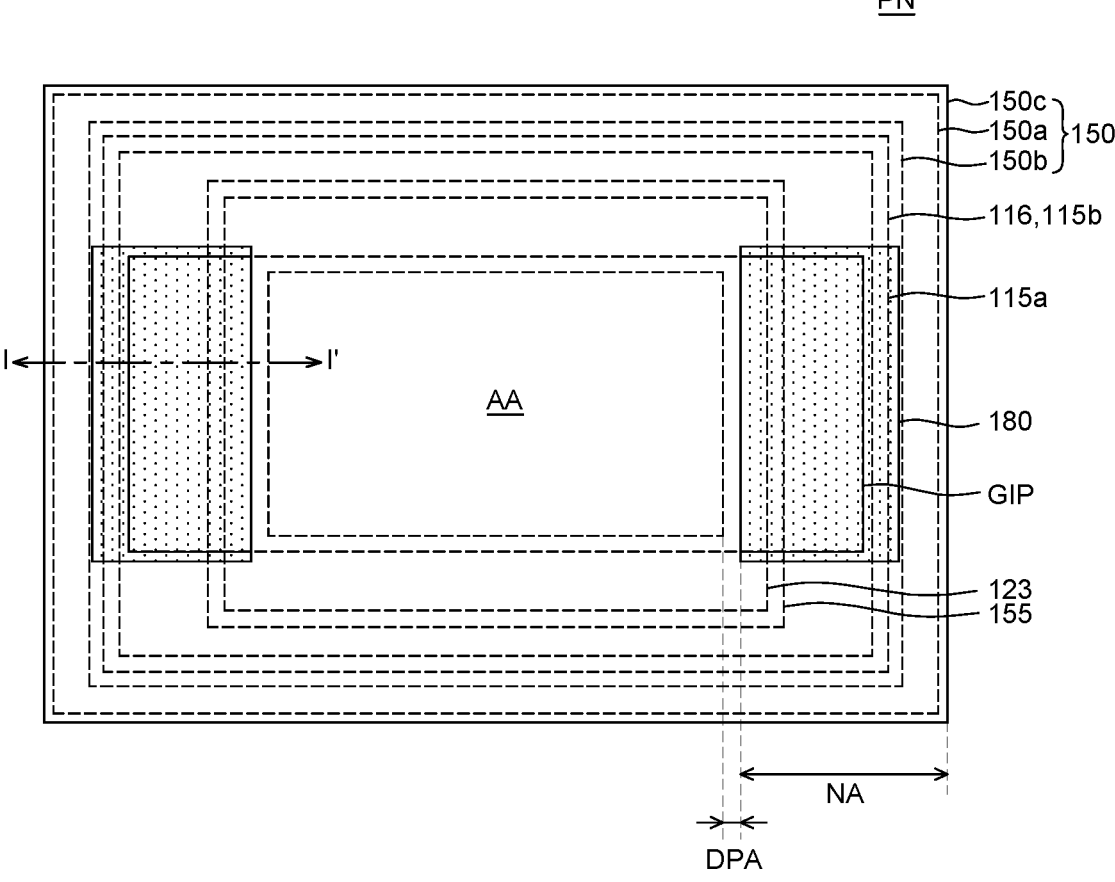
FIG. 3 is a plan view of a display panel according to a first exemplary aspect of the present disclosure.

FIG. 3 is a plan view of the display panel according to the first exemplary aspect of the present disclosure.

Referring to FIG. 3, the display panel PN according to the first exemplary aspect of the present disclosure is a panel for displaying an image to a user.

The display panel PN may include a display element for displaying an image, a driving element for driving the display element, and lines for transmitting various signals to the display element and the driving element. The display element may be defined differently depending on a type of display panel PN. For example, when the display panel PN is an organic light emitting display panel, the display element may be an organic light emitting element including an anode, an organic layer, and a cathode 123.

Hereinafter, it is assumed that the display panel PN is an organic light emitting display panel, but the display panel PN is not limited to the organic light emitting display panel.

The display panel PN may include an active area AA and a non-active area NA.

The active area AA is an area where an image is displayed on the display panel PN.

The plurality of sub-pixels constituting a plurality of pixels and circuits for driving the plurality of sub-pixels may be disposed in the active area AA. The plurality of sub-pixels are minimum units constituting the active area AA, and a display element may be disposed in each of the plurality of sub-pixels, and the plurality of sub-pixels may constitute pixels. For example, an organic light emitting element including an anode, an organic layer, and the cathode 123 may be disposed in each of the plurality of sub-pixels, but the present disclosure is not limited thereto. In addition, the circuits for driving the plurality of sub-pixels may include driving elements and lines. For example, the circuit may include thin film transistors, a storage capacitor, gate lines, data lines, and the like, but the present disclosure is not limited thereto.

The non-active area NA is an area in which an image is not displayed.

Although FIG. 3 illustrates that the non-active area NA surrounds the active area AA having a quadrangular shape, shapes and arrangements of the active area AA and the non-active area NA are not limited to an example shown in FIG. 3.

The active area AA and the non-active area NA may have shapes suitable for a design of an electronic apparatus in which the display panel PN is mounted. For example, the active area AA may have, for example a pentagonal shape, a hexagonal shape, a circular shape, or an elliptical shape.

For example, in the non-active area NA, various lines and circuits for driving the organic light emitting elements of the active area AA may be disposed. For example, in the non-active area NA, driver ICs such as a gate driver IC and a data driver IC, or link lines for transmitting signals to the plurality of sub-pixels and circuits of the active area AA may be disposed, but the present disclosure is not limited thereto.

A left side and a right side of FIG. 3 may be defined as a gate pad portion where a gate driver IC is disposed, and a lower portion of FIG. 3 may be defined as a data pad portion to which a flexible film is connected, but the present disclosure is not limited thereto.

The gate driver IC may be formed independently of the display panel PN and may be configured to be electrically connected to the display panel PN in various manners, but the gate driver IC may be configured in a gate-in-panel (GIP) manner in which it is mounted in the display panel PN. In this case, the non-active area NA may include a GIP area GIP where a GIP circuit is disposed. For example, the GIP area GIP may be located in the non-active area NA on a left side and a right side of the display panel PN.

For example, the non-active area NA may include a dummy pixel area DPA between the GIP area GIP and the active area AA.

The dummy pixel area DPA is an area where dummy pixels are disposed, and may be located to surround a periphery of the active area AA, but the present disclosure is not limited thereto.

The dummy pixel area DPA is an area that does not emit light so as not to affect operations of the sub-pixels of the actual active area AA, and may serve as a buffer. For example, sub-pixels outside the active area AA have a difference in critical dimension (CD) value due to a process variation compared to sub-pixels in other areas. Thus, in designing pixels, it is possible to cope with process variation by arranging dummy pixels that have substantially the same structure as the sub-pixels outside the active area AA but do not emit light.

The display panel PN may include various additional elements for generating various signals or driving pixels in the active area AA. The additional elements for driving the pixels may include an inverter circuit, a multiplexer, an electrostatic discharge (ESD) circuit, and the like. The display panel PN may also include additional elements related to functions other than pixel driving. For example, the display panel PN may include additional elements that provide a touch sensing function, a user authentication function (e.g., fingerprint recognition), a multi-level pressure sensing function, a tactile feedback function, and the like. The aforementioned additional elements may be located in the non-active area NA and/or in an external circuit connected to a connection interface.

Although not shown, the flexible film is a film for supplying signals to the plurality of sub-pixels and circuits of the active area AA, and may be electrically connected to the display panel PN. The flexible film may be disposed on one end of the non-active area NA of the display panel PN and supply power voltages, data voltages and the like to the plurality of sub-pixels and circuits of the active area AA. The driver IC such as a data driver IC may be disposed on the flexible film.

A printed circuit board may be disposed on one end of the flexible film and connected to the flexible film. The printed circuit board is a component that supplies signals to the driver IC. The printed circuit board may supply various signals such as driving signals and data signals to the driver IC.

In the present disclosure, excellent characteristics of the display panel PN are secured by using an oxide thin film transistor having high mobility and low off current characteristics.

When the oxide thin film transistor is used, it is advantageous for low power consumption, stability securing of the thin film transistor, cost reduction, and manufacture of the display panel PN having a large area. In addition, when the GIP circuit is also manufactured using the oxide thin film transistor, an effect of cost reduction due to a decrease in the number of processes is significant. However, since initial characteristics of the oxide thin film transistor may vary due to hydrogen in an interior and an exterior thereof, efforts should be made to block hydrogen as well as moisture or oxygen in the case of the GIP circuit disposed in the GIP area GIP.

Accordingly, the present disclosure may include an encapsulation layer 150 for preventing penetration of external moisture or oxygen to protect the light emitting element that is vulnerable to moisture or oxygen from external moisture or oxygen.

The encapsulation layer 150 may be formed of one layer or may be formed of a plurality of layers. The encapsulation layer 150 may include a primary passivation layer 150*a*, an organic layer 150*b*, and a secondary passivation layer 150*c*.

In addition, according to the present disclosure, one or more dams may be disposed to prevent collapse of the encapsulation layer 150.

The dams may be located at or near a boundary between the active area AA and the non-active area NA. For example, the dams may be located at a point suddenly rising inwardly from the outside. Alternatively, for example, the dam may be located at a point where an inclination of the encapsulation layer 150 changes, for example, suddenly becomes gentle or increases again, while descending along an inclined surface of the encapsulation layer 150.

For example, the dams may have a shape of a frame surrounding the active area AA, but the present disclosure is not limited thereto. For example, the dams may have a shape of a quadrangular frame surrounding the active area AA.

The encapsulation layer 150 may be formed using a silicon oxide (SiOx) or silicon nitride (SiNx)-based insulating material as the primary passivation layer 150*a* and the secondary passivation layer 150*c* to protect the light emitting element from external moisture or oxygen. In this case, a large amount of hydrogen is included in the layer and may affect the oxide thin film transistor. In particular, the oxide thin film transistor of the GIP area GIP having high mobility is more sensitive to hydrogen, and thus, may have a variation in threshold voltage.

Accordingly, according to the present disclosure, a hydrogen adsorption layer 180 may be formed on an upper portion of the GIP area GIP to protect the oxide thin film transistor that is vulnerable to hydrogen disposed in the GIP area GIP. Thus, it is possible to improve characteristics and reliability of the oxide thin film transistor by blocking the introduction of hydrogen into the oxide thin film transistor in the GIP area GIP. For example, diffusible hydrogen generated in the encapsulation layer 150 may diffuse into a lower portion of the GIP area GIP through organic layers of a first planarization layer 115a and a second planarization layer 115b, and a bank 116. In this case, since the hydrogen adsorption layer 180 according to the first exemplary aspect of the present disclosure is disposed between the second planarization layer 115b and the bank 116 on the upper portion of the GIP area, diffusion of hydrogen may be blocked.

The hydrogen adsorption layer 180 may be formed of a titanium (Ti)-based material having excellent hydrogen trapping ability.

For example, the hydrogen adsorption layer 180 according to the first exemplary aspect of the present disclosure may be disposed on the upper portion of the GIP area GIP to cover the GIP area, but the present disclosure is not limited thereto. For example, the hydrogen adsorption layer 180 according to the first exemplary aspect of the present disclosure may completely cover an outside of a planarization layer 115 in the GIP area GIP.

For example, the hydrogen adsorption layer 180 may be disposed in the GIP areas GIP on a left side and a right side of the active area AA to cover the GIP area GIP, but the present disclosure is not limited thereto. For example, the hydrogen absorption layer 180 may be disposed in a shape of a quadrangular frame surrounding the active area AA.

Concrete configurations of the hydrogen adsorption layer 180 and pixels according to the first exemplary aspect of the present disclosure will be described in detail with reference to FIGS. 4 and 5 below.

Figure 4:
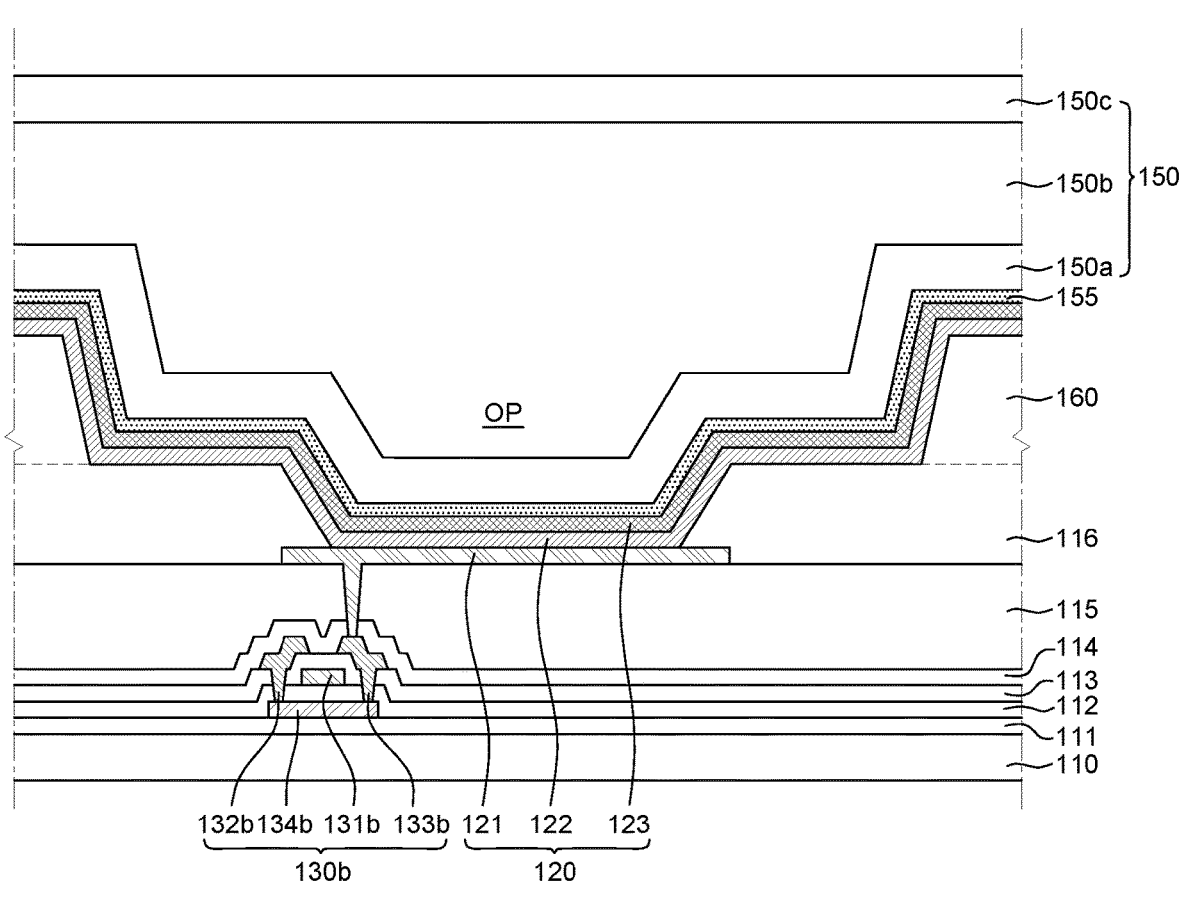
FIG. 4 is a cross-sectional view of one sub-pixel of the display panel of FIG. 3.

FIG. 4 is a cross-sectional view of one sub-pixel of the display panel of FIG. 3.

Figure 5:
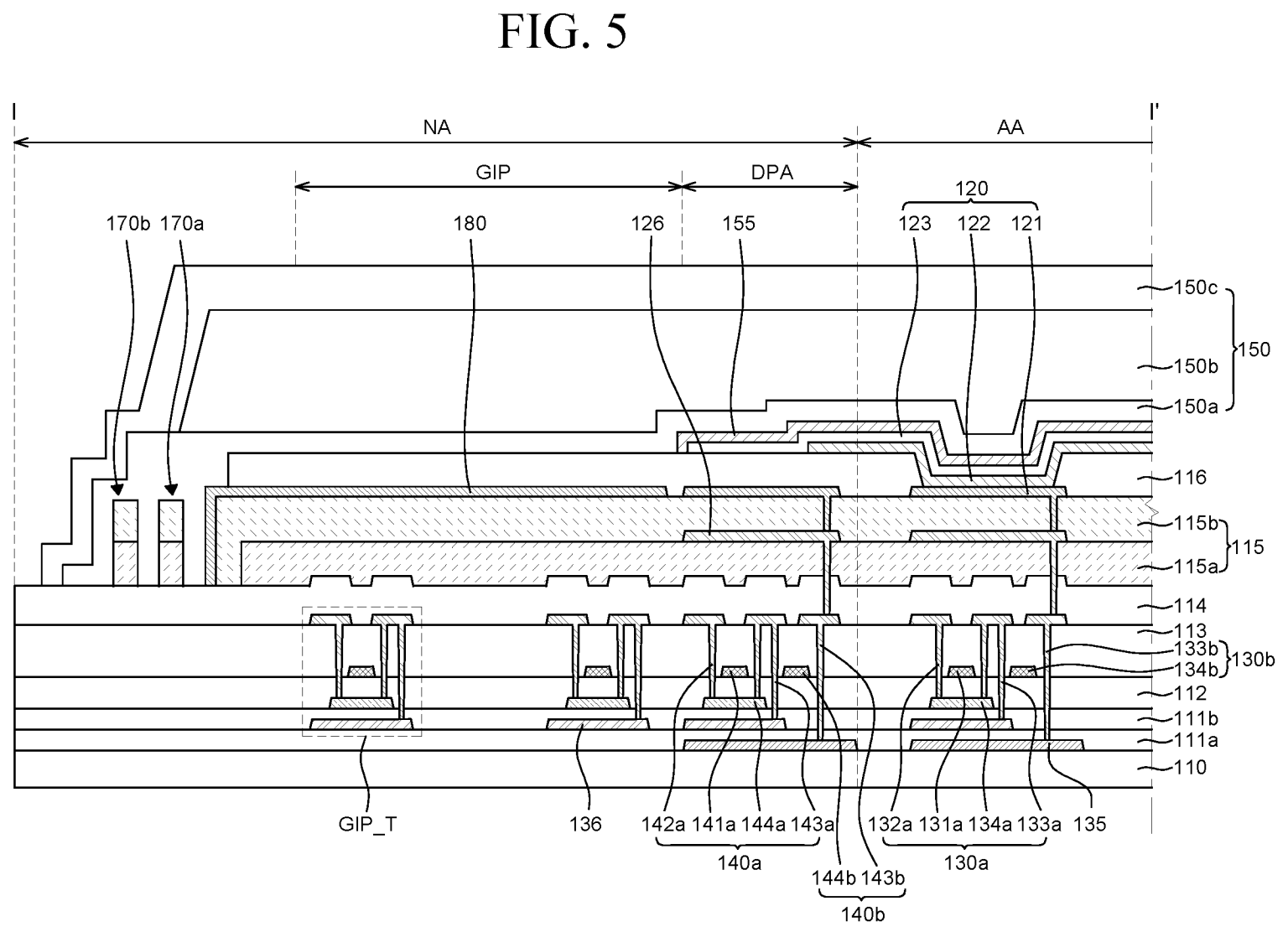

FIG. 5 is a view illustrating a cross-section taken along line I-I' of FIG. 3.

FIG. 5 illustrates a portion of a cross-section of the display panel according to the first exemplary aspect of the present disclosure, including a portion of the active area AA, the GIP area GIA, and the dummy pixel area DPA.

In FIG. 4, for convenience of description, only a driving transistor 130b (the fifth thin film transistor of FIG. 2 described above) is shown among a plurality of the transistors and capacitors of the sub-pixel. In addition, in FIG. 5, for convenience of description, only a portion of a GIP transistor GIP_T in the GIP area GIP is shown. Since a structure of the GIP transistor GIP_T is substantially the same as that of a switching transistor 130a of the active area AA, a description of the structure of the switching transistor 130a will be substituted.

Referring to FIGS. 4 and 5, a substrate 110 is a support member for supporting other components of the display device and may be formed of an insulating material.

For example, the substrate 110 may be formed of glass, resin or the like.

In addition, the substrate 110 may be formed of polymer or plastic such as polyimide (PI), or may be formed of a material having flexibility.

The substrate 110 may be divided into an active area AA and a non-active area NA.

The active area AA is an area where an image is displayed.

The plurality of sub-pixels constituting the plurality of pixels and circuits for driving the plurality of sub-pixels may be disposed in the active area AA. The plurality of sub-pixels are minimum units constituting the active area AA, and a display element may be disposed in each of the plurality of sub-pixels, and the plurality of sub-pixels may constitute the pixels. For example, the light emitting elements 120 including an anode 121, a plurality of organic layers 122, and a cathode 123 may be disposed in the respective sub-pixels, but the present disclosure is not limited thereto. In addition, the circuit for driving the plurality of sub-pixels may include driving elements and lines. For example, the circuit may include thin film transistors 130a and 130b, storage capacitors, gate lines, data lines, and the like, but the present disclosure is not limited thereto.

The non-active area NA is an area in which an image is not displayed.

For example, various lines and circuits for driving the light emitting elements 120 of the active area AA may be disposed in the non-active area NA. For example, driver ICs such as link lines, a gate driver IC, and a data driver IC for transmitting signals to the sub-pixels and circuits of the active area AA may be disposed in the non-active area NA, but the present disclosure is limited thereto.

The non-active area NA may include a GIP area GIP where a GIP circuit is disposed. For example, the GIP area GIP may be located in the non-active area NA on a left side and a right side of the display panel.

For example, the non-active area NA may include a dummy pixel area DPA between the GIP area GIP and the active area AA.

The dummy pixel area DPA is an area where dummy pixels are disposed, and may be located to surround the periphery of the active area AA, but the present disclosure is not limited thereto.

Meanwhile, excellent characteristics of the display panel are secured by using an oxide thin film transistor having high mobility and low off current characteristics. For example, the use of the oxide thin film transistor is advantageous for low power consumption, stability securing of the thin film transistor, cost reduction, and manufacture of a large-area display panel. For example, when the GIP transistor GIP_T in the GIP area GIP is formed of the oxide thin film transistor in the same manner as that of the active area AA, there are advantages in that the number of processes and costs are reduced. However, the oxide thin film transistor has a disadvantage in that an initial characteristic, for example, a threshold voltage, is changed by hydrogen generated inside the display panel.

As described above, the substrate 110 may be divided into the active area AA and the non-active area NA outside the active area AA.

The first and second thin film transistors 130a and 130b, the light emitting element 120, and the encapsulation layer 150 may be disposed in the active area AA of the substrate 110. For example, the first thin film transistor 130a may be a switching transistor, and the second thin film transistor 130b may be a driving transistor.

Also, the non-active area NA of the substrate 110 may include the GIP area GIP and the dummy pixel area DPA.

The GIP transistor GIP_T, third and fourth thin film transistors 140a and 140b, and the encapsulation layer 150 may be disposed in the GIP area GIP and the dummy pixel area DPA of the substrate 110.

A buffer layer 111 may be disposed on the substrate 110.

For example, a first light blocking layer 135 may be disposed on the substrate 110.

The first light blocking layer 135 may be disposed in the active area AA and the dummy pixel area DPA.

For example, the first light blocking layer 135 may be formed of a metallic material having a light blocking function to block external light from being introduced into semiconductor layers 134a, 134b, 144a, and 144b.

For example, the first light blocking layer 135 may be formed of a single layer or multilayer structure formed of any one of opaque metals such as aluminum (Al), chromium (Cr), tungsten (W), titanium (Ti), nickel (Ni), neodymium (Nd), molybdenum (Mo), and copper (Cu), or an alloy thereof.

A first buffer layer 111a may be disposed over the substrate 110 on which the first light blocking layer 135 is disposed.

The first buffer layer 111a may reduce penetration of moisture or impurities through the substrate 110. The first buffer layer 111a may be formed of, for example, a single layer or multiple layers of silicon oxide (SiOx) or silicon nitride (SiNx), but the present disclosure is not limited thereto. The first buffer layer 111a may be omitted depending on a type of the substrate 110 or a type of the transistor, but is not limited thereto.

A second light blocking layer 136 may be disposed on the first buffer layer 111a.

The second light blocking layer 136 may be disposed in the active area AA, the GIP area GIP, and the dummy pixel area DPA.

For example, the second light blocking layer 136 may be composed of a single layer or multilayer structure formed of any one of opaque metals such as aluminum (Al), chromium (Cr), tungsten (W), titanium (Ti), nickel (Ni), neodymium (Nd), molybdenum (Mo), and copper (Cu), or an alloy thereof.

A second buffer layer 111b may be disposed over the substrate 110 on which the second light blocking layer 136 is disposed. For example, the second buffer layer 111b may be composed of, for example, a single layer or multiple layers of silicon oxide (SiOx) or silicon nitride (SiNx), but the present disclosure is not limited thereto. The second buffer layer 111b may be omitted depending on the type of substrate 110 or the type of the transistor, but the present disclosure is not limited thereto.

The first and second thin film transistors 130a and 130b, the third and fourth thin film transistors 140a and 140b, and the GIP transistor GIP_T may be disposed on the second buffer layer 111b.

The first thin film transistor 130a in the active area AA may be a switching transistor.

The first thin film transistor 130a is turned on by a gate pulse supplied to the gate line, and transfers a data voltage supplied through the data line to a gate electrode 131b of the driving transistor.

The first thin film transistor 130a may include a first gate electrode 131a, a first source electrode 132a, a first drain electrode 133a, and a first semiconductor layer 134a.

The second thin film transistor 130b in the active area AA may be a driving transistor, and for convenience, only a portion of the driving transistor is illustrated in FIG. 5.

Other sensing transistors and compensation circuits may also be provided in the display panel.

For example, the second thin film transistor 130b may transfer current that is transmitted through a power supply line, to the anode 121 by a signal that is received from the first thin film transistor 130a, and light emission may be controlled by the current transmitted to the anode 121.

The second thin film transistor 130b may include a second gate electrode 131b, a second source electrode 132b, a second drain electrode 133b, and a second semiconductor layer 134b.

The third thin film transistor 140a in the dummy pixel area DPA may be a switching transistor.

For example, the third thin film transistor 140a may include a third gate electrode 141a, a third source electrode 142a, a third drain electrode 143a, and a third semiconductor layer 144a.

The fourth thin film transistor 140b in the dummy pixel area DPA may be a driving transistor, and for convenience, only a portion of the driving transistor is illustrated in FIG. 5.

For example, the fourth thin film transistor 140b may include a fourth gate electrode, a fourth source electrode, a fourth drain electrode 143b, and a fourth semiconductor layer 144b.

The third thin film transistor 140a in the dummy pixel area DPA may have substantially the same configuration as the first thin film transistor 130a of the active area AA.

Also, the fourth thin film transistor 140b of the dummy pixel area DPA may have substantially the same configuration as the second thin film transistor 130b of the active area AA.

The GIP transistor GIP_T in the GIP area GIP may be a switching transistor and may be configured in substantially the same manner as the first thin film transistor 130a in the active area AA and the third thin film transistor 140a in the dummy pixel area DPA. Thus, redundant descriptions thereof will be omitted.

A semiconductor layer of the GIP transistor GIP_T, the first and second semiconductor layers 134a and 134b of the first and second thin film transistors 130a and 130b, and the third and fourth semiconductor layers 144a and 144b of the third and fourth thin film transistors 140a and 140b may be formed of an oxide semiconductor. Excellent characteristics of the display panel may be secured by using the oxide thin film transistor having high mobility and low off current characteristics. In addition, for example, when the GIP transistor GIP_T of the GIP area GA is formed of the oxide thin film transistor in the same manner as the active area AA, there are advantages in that the number of processes and costs are reduced.

A gate insulating layer 112 may be disposed on the semiconductor layer of the GIP transistor GIP_T and the first, second, third, and fourth semiconductor layers 134a, 134b, 144a, and 144b.

The gate insulating layer 112 may be formed of a single layer of silicon oxide (SiOx) or silicon nitride (SiNx) or multiple layers thereof.

The semiconductor layer of the GIP transistor GIP_T, the first and second semiconductor layers 134a and 134b of the first and second thin film transistors 130a and 130b, and the third and fourth semiconductor layers 144a and 144b of the third and fourth thin film transistors 140a and 140b may include source regions and drain regions containing p-type impurities or n-type impurities, and channel regions between the source regions and the drain regions. In addition, low concentration doping regions may be further included between portions of the source regions and the drain regions that are adjacent to the channel regions. However, the present disclosure is not limited thereto.

The source regions and the drain regions are regions that are doped with impurities at high concentrations, and may be connected to the first, second, third, and fourth source electrodes 132a, 132b, and 142a and the first, second, third, and fourth drain electrodes 133a, 133b, 143a and 143b, respectively.

As impurity ions, p-type impurities or n-type impurities may be used. The p-type impurity may be one of boron (B), aluminum (Al), gallium (Ga), and indium (In), and the n-type impurity may be one of phosphorus (P), arsenic (As) and antimony (Sb).

The channel region may be doped with the n-type impurity or the p-type impurity according to an NMOS or PMOS thin film transistor structure.

The first gate electrode 131a, the second gate electrode 131b, the third gate electrode 141a, and the fourth gate electrode may be disposed on the gate insulating layer 112.

The first gate electrode 131a, the second gate electrode 131b, the third gate electrode 141a, and the fourth gate electrode may be composed of a single layer or multiple layers of conductive metals such as copper (Cu), aluminum (Al), chromium (Cr), molybdenum (Mo), gold (Au), titanium (Ti), nickel (Ni) and neodymium (Nd), or an alloy thereof, but the present disclosure is not limited thereto.

An interlayer insulating layer 113 may be disposed between the first, second, third, and fourth gate electrodes 131a, 131b, and 141a, and the first, second, third, and fourth source electrodes 132a, 132b, and 142a and the first, second, third, fourth drain electrodes 133a, 133b, 143a, and 143b.

The interlayer insulating layer 113 may be formed of a single layer of silicon oxide (SiOx) or silicon nitride (SiNx) or multiple layers thereof.

The first, second, third, and fourth source electrodes 132a, 132b, and 142a and the first, second, third, and fourth drain electrodes 133a, 133b, 143a, and 143b may be disposed on the interlayer insulating layer 113.

The first, second, third, and fourth source electrodes 132a, 132b, and 142a and the first, second, third, and fourth drain electrodes 133a, 133b, 143a, and 143b may be composed of a single layer or multiple layers of metallic materials such as aluminum (Al), molybdenum (Mo), chromium (Cr), gold (Au), titanium (Ti), nickel (Ni), neodymium (Nd), and copper (Cu) which are conductive metals, or an alloy thereof, but the present disclosure is not limited thereto.

The first, second, third, and fourth source electrodes 132a, 132b, and 142a and the first, second, third, and fourth drain electrodes 133a, 133b, 143a, and 143b may respectively have one sides that are electrically connected to the first, second, third, and fourth semiconductor layers 134a, 134b, 144a, and 144b. In addition, the other sides of the first and third drain electrodes 133a and 143a may be electrically connected to the second light blocking layer 136, and the other sides of the second and fourth drain electrodes 133b and 143b may be electrically connected to the first light blocking layer 135, but the present disclosure is not limited thereto.

A passivation layer 114 may be disposed on the GIP transistor GIP_T, the first and second thin film transistors 130a and 130b, and the third and fourth thin film transistors 140a and 140b. The passivation layer 114 may be formed of an inorganic insulating layer such as silicon oxide (SiOx) or silicon nitride (SiNx). The passivation layer 114 may serve to prevent unnecessary electrical connection between components disposed thereabove and therebelow and to prevent contamination or damage from the outside. The passivation layer 114 may be omitted according to configurations and characteristics of the GIP transistor GIP_T, the first and second thin film transistors 130a and 130b, the third and fourth thin film transistors 140a, 140b, and the light emitting element 120.

The planarization layer 115 may be disposed on the passivation layer 114.

The planarization layer 115 is an insulating layer that planarizes an upper portion of the substrate 110.

The planarization layer 115 may be formed of an organic material. For example, the planarization layer 115 may be composed of a single layer or multiple layers of polyimide or photo acryl, but is not limited thereto.

For example, the planarization layer 115 may be composed of multiple layers, the first planarization layer 115a may be disposed on the passivation layer 114, and the second planarization layer 115b may be disposed on the first planarization layer 115a.

An intermediate electrode 126 may be connected to the second and fourth thin film transistors 130b and 140b through contact holes formed in the first planarization layer 115a. However, the present disclosure is not limited thereto. When the planarization layer 115 is composed of a single layer as shown in FIG. 4, the anode 121 may be directly connected to the second and fourth thin film transistors 130b and 140b.

The planarization layer 115 may partially extend to the non-active area NA.

For example, the planarization layer 115 may extend to the non-active area NA to cover the GIP area GIP and the dummy pixel area DPA. For example, the first planarization layer 115a may extend to the non-active area NA to cover the GIP area GIP and the dummy pixel area DPA, and the second planarization layer 115b thereon may extend to the non-active area NA to cover the first planarization layer 115a. In this case, a side surface of the first planarization layer 115a may be covered by the second planarization layer 115b.

A plurality of the light emitting elements 120 may be disposed in the plurality of sub-pixels on the planarization layer 115. The light emitting elements 120 may include the anode 121, the organic layers 122 and the cathode 123. Meanwhile, the organic layers 122 may be configured to include an individual layer disposed in an emission area and a common layer disposed on an entire surface of the substrate 110 as well as the emission area, but the present disclosure is not limited thereto.

The anode 121 may be disposed on the second planarization layer 115b.

The anode 121 may be electrically connected to the second transistor 130b and receive a driving current of the pixel circuit. Since the anode 121 supplies holes to a light emitting layer, it may be formed of a conductive material having a high work function. The anode 121 may be formed of a transparent conductive material such as indium tin oxide (ITO) and indium zinc oxide (IZO), but is not limited thereto.

Meanwhile, the display device may be implemented in a top emission method or bottom emission method. In the case of the top emission method, a reflective layer formed of a metallic material having excellent reflective efficiency, for example, a material such as aluminum (Al) or silver (Ag), may be added under the anode 121 such that light emitted from the light emitting layer is reflected by the anode 121 and directed upward, that is, toward the cathode 153. On the other hand, in the case of the bottom emission method, the anode 121 may be formed of only a transparent conductive material. Hereinafter, descriptions will be made on the assumption that the display device of the present disclosure is in the bottom emission method.

As described above, the light emitting element 120 according to the present disclosure may include the anode 121, the organic layer 122 and the cathode 123.

The organic layer 122 may be disposed between the anode 121 and the cathode 123.

The organic layer 122 is an area in which light is emitted by combination of electrons and holes supplied from the anode 121 and the cathode 123.

The bank 116 may be disposed on the anode 121 and the planarization layer 115. The bank 116 is an insulating layer disposed between the plurality of sub-pixels to distinguish the plurality of sub-pixels.

The bank 116 may include an opening OP exposing a portion of the anode 121. The bank 116 may be an organic insulating material disposed to cover an edge or end portion of the anode 121. The bank 116 may be formed of, for example, polyimide, acryl, or benzo cyclobutene (BCB)-based resin, but the present disclosure is not limited thereto.

The bank 116 may partially extend to the non-active area NA.

For example, the bank 116 may extend to the non-active area NA to cover the GIP area GIP and the dummy pixel area DPA.

For example, the bank 116 may be spaced apart from one end of the planarization layer 115 extending to the non-active area NA.

At least one spacer 160 may be disposed on the bank 116.

The spacer 160 may be disposed on the bank 116 to maintain a predetermined distance from a deposition mask in forming the light emitting element 120. For example, by the spacer 160, the bank 116 and the anode 121 under the spacer 160 and the deposition mask may maintain a certain distance, and damage due to contact thereof may be prevented. The spacer 160 may be formed in a shape in which a width thereof decreases upward, for example, a taper shape to minimize an area in contact with the deposition mask.

According to the present disclosure, to protect the GIP transistor GIP_T of the GIP area GIP, which is vulnerable to hydrogen, the hydrogen adsorption layer 180 may be applied to the upper portion of the GIP area GIP. Accordingly, by blocking the introduction of hydrogen into the GIP transistor GIP_T in the GIP area GIP formed of the oxide thin film transistor, it is possible to improve characteristics and reliability of the GIP transistor GIP_T.

For example, the hydrogen adsorption layer 180 according to the first exemplary aspect of the present disclosure may be disposed between the second planarization layer 115*b* and the bank 116 in the upper portion of the GIP area GIP. Accordingly, diffusible hydrogen generated in the encapsulation layer 150 is adsorbed onto the hydrogen adsorption layer 180 according to the present disclosure, which is disposed between the bank 116 and the second planarization layer 115*b*, and does not spread to the GIP area GIP below.

For example, one end of the hydrogen absorption layer 180 may be spaced apart from the dummy pixel area DPA by a predetermined distance. For example, one end of the hydrogen absorption layer 180 may be spaced apart from the anode 121 of the dummy pixel area DPA by a predetermined distance.

Also, for example, the other end of the hydrogen absorption layer 180 may extend to the non-active area NA to cover the planarization layer 115. For example, the other end of the hydrogen adsorption layer 180 may be spaced apart from a first dam 170*a* by a predetermined distance.

For example, the hydrogen adsorption layer 180 may be configured to include a titanium (Ti)-based material having excellent hydrogen trapping ability. However, the present disclosure is not limited thereto, and the hydrogen adsorption layer 180 may be configured to include a titanium (Ti) alloy or titanium dioxide (TiO2).

For example, the hydrogen adsorption layer 180 may be formed using an atomic layer deposition (ALD) method. In the case of titanium dioxide (TiO2), it may be formed by an ALD method using a titanium chloride (TiCl) precursor.

The hydrogen adsorption layer 180 may be disposed below the bank 116 to avoid short-circuits with the cathode 123.

For example, the hydrogen adsorption layer 180 according to the first exemplary aspect of the present disclosure may be disposed on the upper portion of the GIP area GIP to cover the GIP area GIP. For example, the hydrogen adsorption layer 180 according to the first exemplary aspect of the present disclosure may completely cover an outside of the planarization layer 115 in the GIP area GIP.

Titanium (Ti) is a metal with hydrogen adsorption ability and may effectively block hydrogen.

For example, materials constituting the hydrogen adsorption layer 180 may include one of scandium (Sc), vanadium (V), lead (Pd), niobium (Nb), zirconium (Zr), yttrium (Y), tantalum (Ta), cerium (Ce), lanthanum (La), samarium (Sm), uranium (U), and the like with excellent hydrogen adsorption ability, in addition to titanium (Ti). For reference, a hydrogen solubility of TiH is superior to those of AlH, NiH, AgH, CuH, and ZnH.

In the case of metal hydrides, for example, a hydride of titanium (Ti) is TiH2. 00, which means that two hydrogen (H) atoms may be stored in one titanium (Ti), and it may be seen that the hydride of titanium (Ti) has a hydrogen adsorption ability 1,000,000 times better compared to AlH<2. $5 \times 10^{-8}$, which is a hydride of aluminum (Al). In addition, the hydride of titanium (Ti) has a hydrogen adsorption ability 100,000 times better compared to copper (Cu).

For example, the hydrogen adsorption layer 180 may be disposed in the GIP areas GIP on the left side and the right side of the active area AA to cover the GIP areas GIP, but the present disclosure is not limited thereto. For example, the hydrogen absorption layer 180 may be disposed in a shape of a quadrangular frame surrounding the active area AA.

The organic layer 122 may be disposed on the anode 121 and the bank 116.

The cathode 123 may be disposed on the organic layer 122.

Since the cathode 123 supplies electrons to the organic layer 122, it may be formed of, for example, a conductive material having a low work function. The cathode 123 may be formed as a single layer over the plurality of sub-pixels. For example, the cathode 123 may be formed of a transparent conductive material such as indium tin oxide (ITO) or indium zinc oxide (IZO) or an ytterbium (Yb) alloy, and may further include a metal doped layer. However, the present disclosure is not limited thereto. For example, the cathode 123 may be electrically connected to a low potential power line and receive a low potential power signal.

For example, the anode 121 and cathode 123 of the light emitting element 120 excluding the organic layer 122 may be disposed in the dummy pixel area DPA.

The dummy pixel area DPA is an area that does not emit light so as not to affect operations of the sub-pixels of the actual active area AA, and may serve as a buffer. For example, sub-pixels outside the active area AA have a difference in critical dimension (CD) value due to a process variation compared to sub-pixels in other areas. Thus, in designing pixels, it is possible to cope with process variation by arranging dummy pixels that have substantially the same structure as the sub-pixels outside the active area AA but do not emit light.

The dummy pixel may include two sub-pixels, but is not limited thereto.

To this end, for example, the bank 116 may be disposed on the anode 121 without an open area in the dummy pixel area DPA. In addition, the cathode 123 may be directly disposed on the bank 116.

For example, the organic layer 122 may extend to a portion of the dummy pixel area DPA.

For example, the cathode 123 may extend to the non-active area NA to cover the dummy pixel area DPA. In addition, the cathode 123 may cover the organic layer 122.

As described above, the buffer layer 111, the gate insulating layer 112, the interlayer insulating layer 113, and the passivation layer 114 may extend onto the non-active area NA at the outer portion of the display device.

In addition, the planarization layer 115 and the bank 116 may extend to a portion of the non-active area NA.

A capping layer 155 formed of an organic material such as a polymer or the like may be disposed on the upper portion of the substrate 110 on which the cathode 123 is disposed. However, the present disclosure is not limited thereto, and the capping layer 155 may not be disposed as needed.

In the case of the top emission method, the capping layer 155 has a specific refractive index, so it may serve to collect light and improve light emission, and in the case of the bottom emission method, it may serve as a buffer for the cathode 123 of the light emitting element 120.

The capping layer 155 may serve as one optical control layer. The capping layer 155 may increase reflectance at a boundary between the capping layer 155 and the outside by adjusting a difference in refractive index between the capping layer 155 and the outside. Through this, the capping layer 155 may implement a micro-cavity effect at a specific wavelength. For example, the capping layer 155 may be formed to have different thicknesses for the respective sub-pixels.

For example, the capping layer 155 may extend to the non-active area NA to cover the dummy pixel area DPA. In addition, the capping layer 155 may cover the cathode 123.

The encapsulation layer 150 composed of multiple layers may be disposed on the capping layer 155.

Elements using organic materials, including the light emitting element 120, are very vulnerable to gases in the air, particularly moisture or oxygen, and have low durability against heat, so a thorough encapsulation process is required.

If an appropriate encapsulation process is not accompanied, a lifetime of the element is rapidly reduced, and a dark spot is formed in the element, which may lead to product defects. Conversely, when an appropriate encapsulation process is applied in an element manufacturing process, reliability of the element may be secured and high-quality elements may be produced.

Conventionally, this encapsulation process is largely divided into two methods.

One method is a cover method in which getters are attached into a cover of glass or metal and then, the cover of glass or metal is attached to an element using an adhesive having low water permeability. The other method is a thin film method in which several types of films are laminated and attached to a light emitting element, or a film is directly deposited on the light emitting element.

Among these methods, materials having excellent oxygen barrier and water vapor barrier properties may be mainly used for the film used in the thin film method. For example, for deposition, chemical vapor deposition (CVD), plasma enhanced chemical vapor deposition (PECVD), atomic layer deposition (ALD), and the like may be used.

Specifically describing the encapsulation layer 150, the capping layer 155 is disposed on an upper surface of the substrate 110 on which the light emitting element 120 is formed, and the primary passivation layer 150a, the organic layer 150b, and the secondary passivation layer 150c may be sequentially disposed on the capping layer to constitute the encapsulation layer 150 as an encapsulation means. However, the number of inorganic layers and organic layers constituting the encapsulation layer 150 is not limited thereto.

The primary passivation layer 150a is formed of an inorganic insulating layer, so stack coverage thereof is not good due to a lower step. However, since the organic layer 150b serves to perform a planarization function, the secondary passivation layer 150c is not affected by a step due to the layer disposed therebelow. In addition, since a thickness of the organic layer 150b formed of polymer is sufficiently thick, cracks caused by foreign substances may be compensated.

For example, a protective film formed of multiple layers may be located on the entire surface of the substrate 110 including the secondary passivation layer 150c in a facing manner, for encapsulation. A transparent adhesive having adhesive properties may be interposed between the encapsulation layer 150 and the protective film.

In addition, a polarizing plate for preventing reflection of light incident from the outside may be attached on the protective film.

Meanwhile, in the case of the first exemplary aspect of the present disclosure, the organic layer 150b may be formed by an inkjet method. Accordingly, a plurality of dams 170a and 170b may be provided in the non-active area NA at the outer portion of the display device to control a flow of the organic layer 150b formed of polymer. In this case, the dams 170a and 170b may serve to block moisture penetration from the outside.

For example, the dams 170a and 170b may be located in the non-active area NA. For example, the dams 170a and 170b may be located at a point where a height of the encapsulation layer 150 suddenly rises inwardly from the outside. Alternatively, the dams 170a and 170b may be located at a point where the inclination of the encapsulation layer 150 changes, for example, suddenly becomes gentle or increases again, while descending along the inclined surface of the encapsulation layer 150.

Referring to FIG. 5, the dams 170a and 170b may include the first dam 170a located on an inside thereof and a second dam 170b located on an outside thereof.

When the organic layer 150b in a liquid form is dropped into the active area AA, the dams 170a and 170b may prevent the organic layer 150b in the liquid form from collapsing in a direction of the non-active area NA and invading the pad portion.

At least one of the first dam 170a and the second dam 170b may be formed in a single-layer or multilayer structure. The first dam 170a and/or the second dam 170b may be basically formed in dam formation patterns. The dam formation pattern may have a height greater than that of a touch pad disposed in the pad portion.

For example, the dam formation pattern may be formed of the same material as the planarization layer 115.

For example, the dam formation pattern may be formed of the same material as the planarization layer 115 and the bank 116 for separating the sub-pixels in the active area AA. In some cases, the dam formation pattern may be formed of the same material as the spacer 160 for maintaining an interlayer distance. In this case, the dam formation pattern may be formed simultaneously with the planarization layer 115, the bank 116, and/or the spacer 160, and thus, a dam structure may be formed without an additional mask process and an increase in costs.

Meanwhile, the hydrogen adsorption layer 180 according to the present disclosure may be formed to cover an inside of the planarization layer 115 in the GIP area GIP to more effectively block the introduction of hydrogen into the GIP area GIP, which will be described in detail with reference to the drawings.

Figure 6:
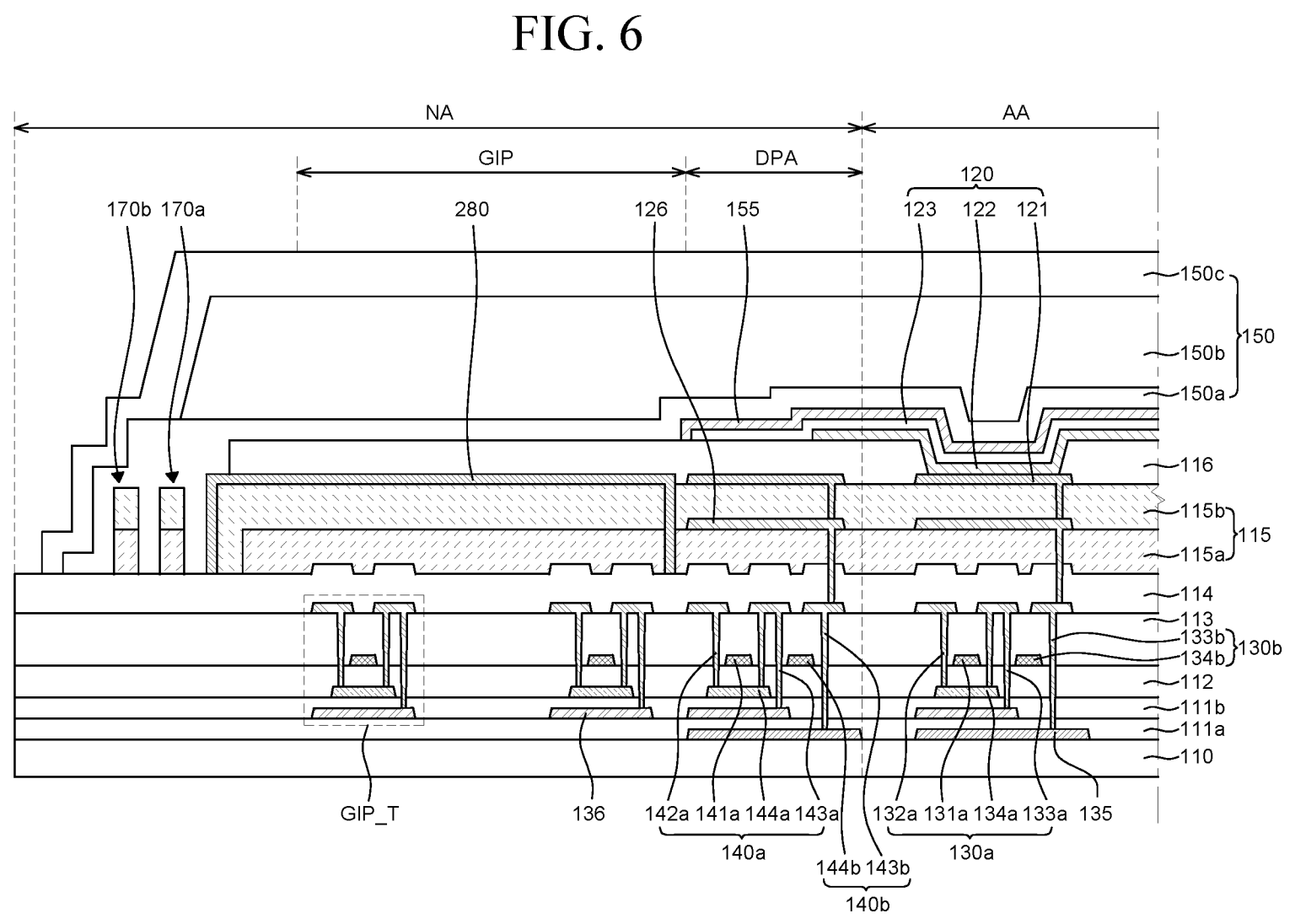

FIG. 6 is a cross-sectional view illustrating a portion of a display panel according to a second exemplary aspect of the present disclosure.

Since other configurations of the display panel according to the second exemplary aspect of the present disclosure shown in FIG. 6 are substantially identical to those of the display panel according to the first exemplary aspect of the present disclosure shown in FIG. 5 with only a difference in configuration of a hydrogen adsorption layer 280, redundant descriptions thereof will be omitted.

FIG. 6 illustrates a portion of a cross-section of the display panel according to the second exemplary aspect of the present disclosure, including a portion of the active area AA, the GIP area GIA, and the dummy pixel area DPA.

In FIG. 6, for convenience of description, only a portion of the GIP transistor GIP_T in the GIP area GIP is shown. Since a structure of the GIP transistor GIP_T is substantially the same as that of the switching transistor 130a of the active area AA, a description of the structure of the switching transistor 130a will be substituted.

Referring to FIG. 6, the substrate 110 may be divided into the active area AA and the non-active area NA.

The non-active area NA may include the GIP area GIP where a GIP circuit is disposed. For example, the GIP area GIP may be located in the non-active area NA on the left side and the right side of the display panel, but the present disclosure is not limited thereto. For example, the non-active area NA may further include the dummy pixel area DPA between the GIP area GIP and the active area AA.

The dummy pixel area DPA is an area where dummy pixels are disposed, and may be located to surround the periphery of the active area AA, but the present disclosure is not limited thereto.

The first and second thin film transistors 130a and 130b, the third and fourth thin film transistors 140a and 140b, and the GIP transistor GIP_T may be disposed on the substrate 110.

The first thin film transistor 130a in the active area AA may be a switching transistor.

The second thin film transistor 130b in the active area AA may be a driving transistor, and for convenience, only a portion of the driving transistor is illustrated in FIG. 6.

Other sensing transistors and compensation circuits may also be provided in the display panel.

The third thin film transistor 140a in the dummy pixel area DPA may be a switching transistor.

The fourth thin film transistor 140b in the dummy pixel area DPA may be a driving transistor, and for convenience, only a portion of the driving transistor is illustrated in FIG. 6.

The GIP transistor GIP_T in the GIP area GIP may be a switching transistor and may be configured in substantially the same manner as the first thin film transistor 130a in the active area AA and the third thin film transistor 140a in the dummy pixel area DPA.

The semiconductor layer of the GIP transistor GIP_T, the first and second semiconductor layers 134a and 134b of the first and second thin film transistors 130a and 130b, and the third and fourth semiconductor layers 144a and 144b of the third and fourth thin film transistors 140a and 140b may be formed of an oxide semiconductor.

The planarization layer 115 may be disposed on the GIP transistor GIP_T, the first and second thin film transistors 130a and 130b, and the third and fourth thin film transistors 140a and 140b.

The planarization layer 115 may partially extend to the non-active area NA.

For example, the planarization layer 115 may extend to the non-active area NA to cover the GIP area GIP and the dummy pixel area DPA. For example, the first planarization layer 115a may extend onto the non-active area NA to cover the GIP area GIP and the dummy pixel area DPA, and the second planarization layer 115b disposed thereon may extend to the non-active area NA to cover the first planarization layer 115a. In this case, the side surface of the first planarization layer 115a may be covered by the second planarization layer 115b.

The plurality of light emitting elements 120 may be disposed in the plurality of sub-pixels on the planarization layer 115. The light emitting element 120 may include the anode 121, the organic layer 122 and the cathode 123.

The bank 116 may be disposed on the anode 121 and the planarization layer 115.

The bank 116 may partially extend to the non-active area NA.

For example, the bank 116 may extend to the non-active area NA to cover the GIP area GIP and the dummy pixel area DPA.

For example, the bank 116 may be spaced apart from one end of the planarization layer 115 extending to the non-active area NA.

According to the present disclosure, to protect the GIP transistor GIP_T of the GIP area GIP, which is vulnerable to hydrogen, the hydrogen adsorption layer 280 may be applied to the upper portion of the GIP area GIP.

For example, the hydrogen adsorption layer 280 according to the second exemplary aspect of the present disclosure may be disposed between the second planarization layer 115b and the bank 116 in the upper portion of the GIP area GIP. Accordingly, diffusible hydrogen generated in the encapsulation layer 150 is adsorbed onto the hydrogen adsorption layer 280 according to the present disclosure, which is disposed between the bank 116 and the second planarization layer 115b, and does not spread to the GIP area GIP below.

For example, one end of the hydrogen absorption layer 280 may be spaced apart from the dummy pixel area DPA by a predetermined distance and may pass through the planarization layer 115 to cover the inside of the GIP area GIP. For example, one end of the hydrogen absorption layer 280 may be spaced apart from the anode 121 of the dummy pixel area DPA by a predetermined distance and may pass through the planarization layer 115 to come into contact with a surface of the passivation layer 114. Thus, the inside of the planarization layer 115 in the GIP area GIP may be covered.

Also, for example, the other end of the hydrogen absorption layer 280 may extend to the non-active area NA to cover the planarization layer 115. For example, the other end of the hydrogen adsorption layer 280 may be spaced apart from the first dam 170a by a predetermined distance and may cover the outside of the planarization layer 115 in the GIP area GIP.

For example, the hydrogen adsorption layer 280 may be configured to include a titanium (Ti)-based material having excellent hydrogen trapping ability. However, the present disclosure is not limited thereto, and the hydrogen adsorption layer 280 may be configured to include a titanium (Ti) alloy or titanium dioxide (TiO2).

For example, the hydrogen adsorption layer 280 may be formed using an atomic layer deposition (ALD) method. In the case of titanium dioxide (TiO2), it may be formed by an ALD method using a titanium chloride (TiCl) precursor.

The hydrogen adsorption layer 280 may be disposed below the bank 116 to avoid short-circuits with the cathode 123.

For example, the hydrogen adsorption layer 280 according to the second exemplary aspect of the present disclosure may be disposed on the upper portion of the GIP area GIP to cover the GIP area GIP. For example, the hydrogen adsorption layer 280 according to the second exemplary aspect of the present disclosure may completely cover the outside and the inside of the planarization layer 115 in the GIP area GIP.

For example, materials constituting the hydrogen adsorption layer 280 may include scandium (Sc), vanadium (V), lead (Pd), niobium (Nb), zirconium (Zr), yttrium (Y), tantalum (Ta), cerium (Ce), lanthanum (La), samarium (Sm), uranium (U), and the like with excellent hydrogen adsorption ability, in addition to titanium (Ti).

For example, the hydrogen adsorption layer 280 may be disposed in the GIP areas GIP on the left side and the right side of the active area AA to cover the GIP area GIP, but the present disclosure is not limited thereto. For example, the hydrogen adsorption layer 280 may be disposed in a shape of a quadrangular frame surrounding the active area AA.

For example, the anode 121 and cathode 123 of the light emitting element 120 excluding the organic layer 122 may be disposed in the dummy pixel area DPA.

The dummy pixel may include two sub-pixels, but is not limited thereto.

To this end, for example, the bank 116 may be disposed on the anode 121 without an open area in the dummy pixel area DPA. In addition, the cathode 123 may be directly disposed on the bank 116.

For example, the organic layer 122 may extend to a portion of the dummy pixel area DPA.

For example, the cathode 123 may extend to the non-active area NA to cover the dummy pixel area DPA. In addition, the cathode 123 may cover the organic layer 122.

Meanwhile, in the present disclosure, by further disposing a hydrogen adsorption layer below the planarization layer 115, it is possible to more effectively block the introduction of moisture or hydrogen into the GIP area GIP, which will be described in detail with reference to the drawings.

Figure 7:
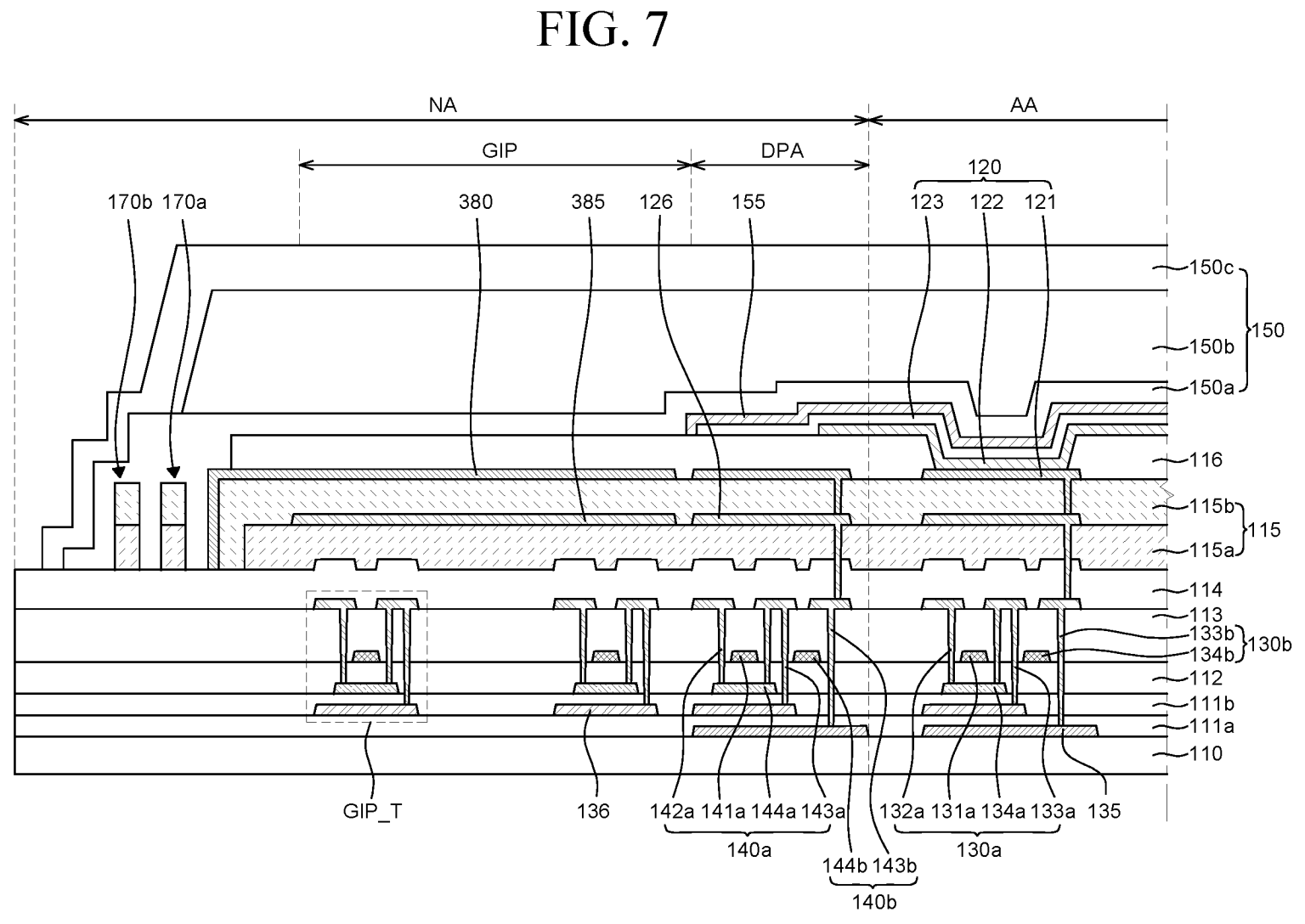

FIG. 7 is a cross-sectional view illustrating a portion of a display panel according to a third exemplary aspect of the present disclosure.

Figure 8:
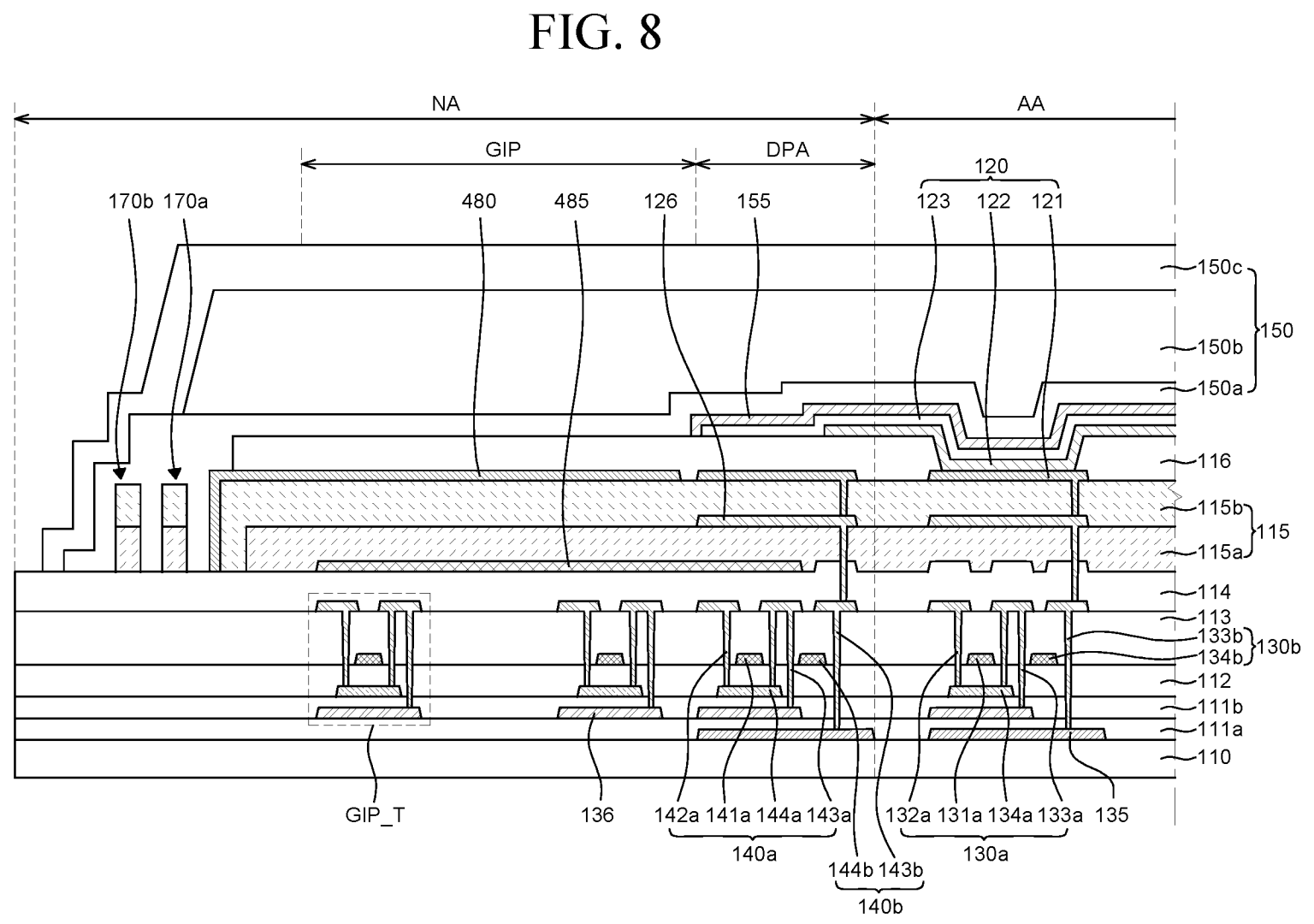

FIG. 8 is a cross-sectional view illustrating a portion of a display panel according to a fourth exemplary aspect of the present disclosure.

Since other configurations of the display panels according to the third and fourth exemplary aspects of the present disclosure shown in FIGS. 7 and 8 are substantially identical to those of the display panel according to the first exemplary aspect of the present disclosure shown in FIG. 5 with only differences in that configurations of second hydrogen absorption layers 385 and 485 are added. In addition, since FIGS. 7 and 8 are different from each other only in arrangement positions of the second hydrogen adsorption layers 385 and 485, redundant descriptions will be omitted and descriptions of FIGS. 7 and 8 will be made together.

FIGS. 7 and 8 show portions of cross-sections of the display panels according to third and fourth exemplary aspects including a portion of the active area AA, the GIP area GIA, and the dummy pixel area DPA.

FIGS. 7 and 8 show only a portion of the GIP transistor GIP_T in the GIP area GIP for convenience of description. At this time, as described above, since the structure of the GIP transistor GIP_T is substantially the same as the structure of the switching transistor 130a of the active area AA, a description of the structure of the switching transistor 130a will be substituted.

Referring to FIGS. 7 and 8, the substrate 110 may be divided into the active area AA and the non-active area NA.

For example, the non-active area NA may include the GIP area GIP where a GIP circuit is disposed. In addition, the non-active area NA may further include the dummy pixel area DPA between the GIP area GIP and the active area AA.

The first and second thin film transistors 130a and 130b, the third and fourth thin film transistors 140a and 140b, and the GIP transistor GIP_T may be disposed on the substrate 110.

The semiconductor layer of the GIP transistor GIP_T, the first and second semiconductor layers 134a and 134b of the first and second thin film transistors 130a and 130b, and the third and fourth semiconductor layers 144a and 144b of the third and fourth thin film transistors 140a and 140b may be formed of an oxide semiconductor.

The passivation layer 114 and the planarization layer 115 may be disposed on the GIP transistor GIP_T, the first and second thin film transistors 130a and 130b, and the third and fourth thin film transistors 140a and 140b.

The passivation layer 114 and the planarization layer 115 may partially extend to the non-active area NA.

For example, the planarization layer 115 may be composed of multiple layers, the first planarization layer 115a may be disposed on the passivation layer 114, and the second planarization layer 115b may be disposed on the first planarization layer 115a. For example, the first planarization layer 115a may extend to the non-active area NA to cover the GIP area GIP and the dummy pixel area DPA, and the second planarization layer 115b may extend to the non-active area NA to cover the first planarization layer 115a. In this case, the side surface of the first planarization layer 115a may be covered by the second planarization layer 115b.

The plurality of light emitting elements 120 may be disposed in the plurality of sub-pixels on the planarization layer 115. The light emitting element 120 may include the anode 121, the organic layer 122 and the cathode 123.

The bank 116 may be disposed on the anode 121 and the planarization layer 115.

The bank 116 may partially extend to the non-active area NA.

For example, the bank 116 may extend to the non-active area NA to cover the GIP area GIP and the dummy pixel area DPA.

For example, the bank 116 may be spaced apart from one end of the planarization layer 115 extending to the non-active area NA.

According to the present disclosure, to protect the GIP transistor GIP_T in the GIP area GIP, which is vulnerable to hydrogen, first hydrogen adsorption layers 380 and 480 may be applied to the upper portion of the GIP area GIP.

For example, the first hydrogen adsorption layers 380 and 480 according to the third and fourth exemplary aspects of the present disclosure may be disposed between the second planarization layer 115b and the bank 116 on the upper portion of the GIP area.

For example, one ends of the first hydrogen absorption layers 380 and 480 may be spaced apart from the dummy pixel area DPA by a predetermined distance.

Also, for example, the other ends of the first hydrogen absorption layers 380 and 480 may extend to the non-active area NA to cover the planarization layer 115.

For example, the other ends of the first hydrogen adsorption layers 380 and 480 may be spaced apart from the first dam 170a by a predetermined distance and may cover the outside of the planarization layer 115 in the GIP area GIP.

For example, the first hydrogen adsorption layers 380 and 480 may be configured to include a titanium (Ti)-based material having an excellent hydrogen trapping ability. However, the present disclosure is not limited thereto, and the first hydrogen adsorption layers 380 and 480 may be configured to include a titanium (Ti) alloy or titanium dioxide (TiO2). For example, materials constituting the first hydrogen adsorption layers 380 and 480 may include scandium (Sc), vanadium (V), lead (Pd), niobium (Nb), zirconium (Zr), yttrium (Y), tantalum (Ta), cerium (Ce), lanthanum (La), samarium (Sm), uranium (U), and the like with excellent hydrogen adsorption ability, in addition to titanium (Ti).

For example, the first hydrogen adsorption layers 380 and 480 may be formed using an atomic layer deposition (ALD) method. In the case of titanium dioxide (TiO2), it may be formed by an ALD method using a titanium chloride (TiCl) precursor.

For example, the first hydrogen adsorption layers 380 and 480 may be disposed below the bank 116 to avoid short-circuits with the cathode 123.

Also, for example, the first hydrogen adsorption layers 380 and 480 may be disposed in the GIP areas GIP on the left side and the right side of the active area AA to cover the GIP area GIP, but the present disclosure is not limited thereto. For example, the first hydrogen adsorption layers 380 and 480 may be disposed in a shape of a quadrangular frame surrounding the active area AA.

According to the third exemplary aspect of the present disclosure, the second hydrogen adsorption layer 385 may be additionally disposed between the first planarization layer 115a and the second planarization layer 115b. For example, the second hydrogen adsorption layer 385 according to the third exemplary aspect may be disposed below the first hydrogen adsorption layer 380 and disposed on the same layer as the anode 121. For example, the second hydrogen adsorption layer 385 according to the third exemplary aspect may be disposed on the upper portion of the GIP area GIP to cover the GIP area GIP. For example, the second hydrogen adsorption layer 385 according to the third exemplary aspect may be disposed on the first planarization layer 115a to cover the GIP area GIP. For example, one end of the second hydrogen absorption layer 385 according to the third exemplary aspect may be spaced apart from the anode 121 of the dummy pixel area DPA by a predetermined distance.

For example, the second hydrogen adsorption layer 385 according to the third exemplary aspect may be disposed in the GIP areas GIP on the left side and the right side of the active area AA to cover the GIP areas GIP, but the present disclosure is not limited thereto. For example, the second hydrogen absorption layer 385 of the third exemplary aspect may be disposed in a shape of a quadrangular frame surrounding the active area AA.

According to the fourth exemplary aspect of the present disclosure, the second hydrogen adsorption layer 485 may be additionally disposed between the first planarization layer 115a and the passivation layer 114. For example, the second hydrogen adsorption layer 485 according to the fourth exemplary aspect may be disposed on the passivation layer 114 below the first hydrogen adsorption layer 480. For example, the second hydrogen adsorption layer 485 according to the fourth exemplary aspect may be disposed on the upper portion of the GIP area GIP to cover the GIP area GIP. For example, one end of the second hydrogen absorption layer 485 according to the fourth exemplary aspect may be spaced apart from the dummy pixel area DPA by a predetermined distance.

For example, the second hydrogen adsorption layer 485 according to the fourth exemplary aspect may be disposed in the GIP areas GIP on the left side and the right side of the active area AA to cover the GIP areas GIP, but the present disclosure is not limited thereto. For example, the second hydrogen adsorption layer 485 according to the fourth exemplary aspect may be disposed in a shape of a quadrangular frame surrounding the active area AA.

Also, for example, the second hydrogen absorption layer 485 according to the fourth exemplary aspect may have one end extending to the dummy pixel area DPA to cover a portion of the dummy pixel area DPA, but the present disclosure is limited thereto.

The second hydrogen adsorption layers 385 and 485 additionally adsorb hydrogen that is not adsorbed by the first hydrogen adsorption layers 380 and 480, thereby more effectively blocking the introduction of moisture or hydrogen.

For example, the second hydrogen adsorption layers 385 and 485 may be configured to include a titanium (Ti)-based material. However, the present disclosure is not limited thereto, and the second hydrogen adsorption layers 385 and 485 may be configured to include a titanium (Ti) alloy or titanium dioxide (TiO2).

For example, materials constituting the second hydrogen adsorption layers 385 and 485 may include scandium (Sc), vanadium (V), lead (Pd), niobium (Nb), zirconium (Zr), yttrium (Y), tantalum (Ta), cerium (Ce), lanthanum (La), samarium (Sm), uranium (U), and the like with excellent hydrogen adsorption ability, in addition to titanium (Ti).

For example, the anode 121 and cathode 123 of the light emitting element 120 excluding the organic layer 122 may be disposed in the dummy pixel area DPA.

The dummy pixel may include two sub-pixels, but is not limited thereto.

To this end, for example, the bank 116 may be disposed on the anode 121 without an open area in the dummy pixel area DPA. In addition, the cathode 123 may be directly disposed on the bank 116.

For example, the organic layer 122 may extend to a portion of the dummy pixel area DPA.

For example, the cathode 123 may extend to the non-active area NA to cover the dummy pixel area DPA. In addition, the cathode 123 may cover the organic layer 122.

The exemplary aspects of the present disclosure may also be described as follows:

According to an aspect of the present disclosure, there is provided a display device. The display device comprises a substrate divided into an active area and a non-active area including a gate-in-panel (GIP) area, a planarization layer disposed over the substrate and extending to the non-active area, a bank disposed over the planarization layer and extending to the non-active area, an encapsulation layer disposed over the bank and a hydrogen absorption layer disposed between the bank and the planarization layer to cover the GIP area.

The GIP area may include an oxide thin film transistor.

The non-active area may further include a dummy pixel area between the GIP area and the active area.

One end of the hydrogen absorption layer may be spaced apart from the dummy pixel area by a predetermined distance.

One end of the hydrogen absorption layer may pass through the planarization layer and may surround an inside of the planarization layer.

The other end of the hydrogen absorption layer may extend to the non-active area to cover an outside of the planarization layer.

The hydrogen adsorption layer may include any one of titanium (Ti), scandium (Sc), vanadium (V), lead (Pd), niobium (Nb), zirconium (Zr), yttrium (Y), tantalum (Ta), cerium (Ce), lanthanum (La), samarium (Sm), and uranium (U).

The hydrogen adsorption layer may include a titanium (Ti) alloy or titanium dioxide ($TiO_2$).

The hydrogen absorption layer may have a shape of a frame surrounding the active area.

The display device may further include a dam disposed over the substrate in the non-active area.

The dam may have a shape of a frame surrounding the active area.

The other end of the hydrogen adsorption layer may be spaced apart from the dam by a predetermined distance.

The display device may further include a light emitting element disposed over the planarization layer and including an anode, an organic layer, and a cathode.

The dummy pixel area may be an area where dummy pixels are disposed, and may be located to surround a periphery of the active area.

The dummy pixels may include a thin film transistor having a structure corresponding to a thin film transistor disposed in the active area.

The anode and the cathode of the light emitting element excluding the organic layer may be disposed to extend in the dummy pixel area.

In the dummy pixel area, the bank may be disposed without an open area on the anode of the dummy pixel area, and the cathode of the dummy pixel area may be disposed on the bank.

One end of the hydrogen absorption layer may be disposed on the same layer as the anode of the dummy pixel area and spaced apart from the anode of the dummy pixel area by a predetermined distance.

The planarization layer may be composed of multiple layers of a first planarization layer and a second planarization layer, and the display device may further include an additional hydrogen absorption layer disposed under the hydrogen absorption layer between the first planarization layer and the second planarization layer.

The planarization layer may be composed of a first planarization layer over a passivation layer and a second planarization layer over the first planarization layer, and the display device may further include an additional hydrogen absorption layer disposed under the hydrogen absorption layer and between the passivation layer and the first planarization layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate divided into an active area and a non-active area including a gate-in-panel (GIP) area;
a planarization layer disposed over the substrate and extending to the non-active area;
a bank disposed over the planarization layer and extending to the non-active area;
an encapsulation layer disposed over the bank; and
a hydrogen absorption layer disposed between the bank and the planarization layer to cover the GIP area.

2. The display device of claim 1, wherein the GIP area includes an oxide thin film transistor.

3. The display device of claim 1, wherein the non-active area further includes a dummy pixel area between the GIP area and the active area.

4. The display device of claim 3, wherein one end of the hydrogen absorption layer is spaced apart from the dummy pixel area by a predetermined distance.

5. The display device of claim 4, wherein one end of the hydrogen absorption layer passes through the planarization layer and surrounds an inside of the planarization layer.

6. The display device of any one of claim 5, wherein another end of the hydrogen absorption layer extends to the non-active area to cover an outside of the planarization layer.

7. The display device of claim 6, further comprising a dam disposed over the substrate in the non-active area.

8. The display device of claim 7, wherein the dam has a shape of a frame surrounding the active area.

9. The display device of claim 7, wherein another end of the hydrogen adsorption layer is spaced apart from the dam by a predetermined distance.

10. The display device of claim 3, further comprising a light emitting element disposed over the planarization layer and including an anode, an organic layer, and a cathode.

11. The display device of claim 10, wherein the dummy pixel area is an area where dummy pixels are disposed, and is located to surround a periphery of the active area.

12. The display device of claim 11, wherein the dummy pixels include a thin film transistor having a structure corresponding to a thin film transistor disposed in the active area.

13. The display device of claim 11, wherein the anode and the cathode of the light emitting element excluding the organic layer are disposed to extend in the dummy pixel area.

14. The display device of claim 13, wherein, in the dummy pixel area, the bank is disposed without an open area on the anode of the dummy pixel area, and the cathode of the dummy pixel area is disposed on the bank.

15. The display device of claim 13, wherein one end of the hydrogen absorption layer is disposed on a same layer as the anode of the dummy pixel area and spaced apart from the anode of the dummy pixel area by a predetermined distance.

16. The display device of claim 1, wherein the hydrogen adsorption layer includes one of titanium (Ti), scandium (Sc), vanadium (V), lead (Pd), niobium (Nb), zirconium (Zr), yttrium (Y), tantalum (Ta), cerium (Ce), lanthanum (La), samarium (Sm), and uranium (U).

17. The display device of claim 1, wherein the hydrogen adsorption layer includes a titanium (Ti) alloy or titanium dioxide ($TiO_2$).

18. The display device of claim 1, wherein the hydrogen absorption layer has a shape of a frame surrounding the active area.

19. The display device of claim 1, wherein the planarization layer is composed of multiple layers of a first planarization layer and a second planarization layer, and wherein the display device further includes an additional hydrogen absorption layer disposed under the hydrogen absorption layer between the first planarization layer and the second planarization layer.

20. The display device of claim 1, wherein the planarization layer is composed of a first planarization layer over a passivation layer and a second planarization layer over the first planarization layer, and wherein the display device further includes an additional hydrogen absorption layer disposed under the hydrogen absorption layer and between the passivation layer and the first planarization layer.

* * * * *